(12) United States Patent
Wienand et al.

(10) Patent No.: US 9,155,129 B2
(45) Date of Patent: Oct. 6, 2015

(54) MICROSTRUCTURED HOT STAMPING DIE

(75) Inventors: Karlheinz Wienand, Aschaffenburg (DE); Matsvei Zinkevich, Goldbach (DE)

(73) Assignee: Heraeus Sensor Technology GmbH, Hanau (DE)

( * ) Notice: Subject to any disclaimer, the term of this patent is extended or adjusted under 35 U.S.C. 154(b) by 0 days.

(21) Appl. No.: 14/236,385

(22) PCT Filed: Jun. 27, 2012

(86) PCT No.: PCT/EP2012/002707
§ 371 (c)(1),
(2), (4) Date: Jan. 31, 2014

(87) PCT Pub. No.: WO2013/017185
PCT Pub. Date: Feb. 7, 2013

(65) Prior Publication Data
US 2014/0174307 A1  Jun. 26, 2014

(30) Foreign Application Priority Data
Aug. 2, 2011 (DE) .......................... 10 2011 052 365

(51) Int. Cl.
*B41B 5/00* (2006.01)
*H05B 3/28* (2006.01)
(Continued)

(52) U.S. Cl.
CPC .................. *H05B 3/28* (2013.01); *H05B 3/283* (2013.01); *H05K 13/00* (2013.01); *B29C 43/52* (2013.01); *B29K 2909/02* (2013.01);
(Continued)

(58) Field of Classification Search
CPC ....................................... H05B 3/283

USPC ........................................................... 101/21
See application file for complete search history.

(56) References Cited

U.S. PATENT DOCUMENTS 3,515,059 A * 6/1970 Sciame ........................ 101/31
3,946,195 A 3/1976 Lyons et al.
(Continued)

FOREIGN PATENT DOCUMENTS

DE 3325310 A1 1/1985
DE 3829297 A1 8/1989
(Continued)

OTHER PUBLICATIONS

Int'l Preliminary Report on Patentability mailed Feb. 13, 2014 in Int'l Application No. PCT/EP2012/002707.
(Continued)

*Primary Examiner* — Anthony Nguyen
(74) *Attorney, Agent, or Firm* — Panitch Schwarze Belisario & Nadel LLP

(57) ABSTRACT

A stamping die for hot stamping a material includes a profiled stamping surface, wherein the stamping die includes at least one thermally insulating substrate, on which an electrically conductive structure having a heating resistor is arranged, and wherein the electrically conductive structure is covered by an electrically insulating film. The surface of the electrically insulating film includes the profiled stamping surface and the electrically insulating film covers at least the heating resistor such that the electrically insulating film with the stamping surface can be electrically heated by the heating resistor. A method for hot stamping a material using such a stamping die includes heating the resistor to a temperature between 100° C. and 800° C.

15 Claims, 2 Drawing Sheets

(51) Int. Cl.
*H05K 13/00* (2006.01)
*B29C 43/52* (2006.01)
*H05K 1/03* (2006.01)
*H05K 1/16* (2006.01)
*H05K 3/28* (2006.01)

(52) U.S. Cl.
CPC ............. *H05K 1/0306* (2013.01); *H05K 1/167* (2013.01); *H05K 3/281* (2013.01); *Y10T 29/49146* (2015.01)

(56) References Cited

U.S. PATENT DOCUMENTS

| | | | | |
|---|---|---|---|---|
| 4,343,670 | A | * | 8/1982 | Brown ............................ 156/233 |
| 4,586,690 | A | | 5/1986 | Hartel et al. |
| 4,886,630 | A | | 12/1989 | Sugiura et al. |
| 4,928,588 | A | | 5/1990 | Mathis |
| 4,956,543 | A | * | 9/1990 | Shibata ........................... 219/227 |
| 5,105,065 | A | * | 4/1992 | Shibata ........................... 219/227 |
| 5,420,612 | A | * | 5/1995 | Brock et al. ................... 347/201 |
| 8,138,881 | B2 | * | 3/2012 | Zinkevich ..................... 338/308 |
| 2002/0043161 | A1 | * | 4/2002 | Hutchison et al. ............. 101/28 |
| 2011/0305259 | A1 | | 12/2011 | Wienand et al. |

FOREIGN PATENT DOCUMENTS

| | | |
|---|---|---|
| DE | 19942364 A1 | 3/2001 |
| DE | 102004025568 A1 | 2/2006 |
| DE | 102009007940 A1 | 9/2010 |
| EP | 2316286 A1 | 5/2011 |
| EP | 2493342 A1 | 9/2012 |
| EP | 2850956 A1 | 3/2015 |
| JP | H04-129711 A | 4/1992 |
| JP | 2004-148398 A | 5/2004 |
| WO | 03049915 A1 | 6/2003 |

OTHER PUBLICATIONS

Int'l Search Report issued Jan. 9, 2013 in Int'l Application No. PCT/EP2012/002707.
Submission in Response to Int'l Search Report, dated Jan. 30, 2013.
Office Action issued Sep. 27, 2013 in DE Application No. 10 2011 052 365.0.
Office Action issued Mar. 20, 2012 in DE Application No. 10 2011 052 365.0.

* cited by examiner

MICROSTRUCTURED HOT STAMPING DIE

CROSS-REFERENCE TO RELATED APPLICATIONS

This application is a Section 371 of International Application No. PCT/EP2012/002707, filed Jun. 27, 2012, which was published in the German language on Feb. 7, 2013, under International Publication No. WO 2013/017185 A1 and the disclosure of which is incorporated herein by reference.

BACKGROUND OF THE INVENTION

The invention relates to a stamping die for hot stamping a material, comprising a profiled stamping surface.

The invention also relates to a method for hot stamping a material using such a stamping die and to a method for producing such a stamping die.

Hot stamping methods are used to form, inscribe, and label various materials, in particular plastics. In doing so, the material is oxidised, formed or pyrolysed.

A device for stamping a film during a thermoforming process is known from DE 10 2004 025 568 A1 and comprises a positive stamping die. The stamping die is heatable in order to achieve flawless stamping without distortion or damage of the film.

DE 38 29 297 A1 discloses a stamping die with metal resistor tracks on a printed circuit board as heating device, on which a profiled die body formed from a rubber mixture is arranged. The arrangement is lined on the underneath with a pressure pad. The design is bulky, wherein the total volume ultimately has to be heated, and additionally can only be used for specific applications due to the soft design.

WO 03/049 915 A1 discloses a heatable hot stamping tool for microstructuring a thermoplastic material in a continuous method. The hot stamping tool is soldered together from segments, wherein the solder has material properties different from the segments. Stamping occurs at a temperature above the glass transition temperature of the plastic to be stamped. At the same time, a pressure is applied, wherein the film to be stamped is cooled under pressure.

Such heatable stamping dies are usually fabricated from metal and are heated externally by means of heating cartridges or gas burners.

A disadvantage of this is that at least the entire stamping die has to be heated, whereby a lot of energy has to be applied accordingly. In addition, in particular in the case of an inscription, clear delimitations of the stamped shapes are desirable. When assembling such a heatable stamping die, the high temperature thereof and the thermal loading of the assembly location must additionally be considered. Skin contact with parts of the stamping die or the regions in the vicinity may lead to burns. The larger the thermal capacity of the heated stamping die, the more time is required before the stamping die will have cooled to such an extent that it can be disassembled or replaced safely. In order to achieve cooling when stamping, the stamping die must either be actively cooled or a sufficient time must elapse before the stamping process is complete.

BRIEF SUMMARY OF THE INVENTION

The object of the invention is therefore to overcome the disadvantages of the prior art. In particular, energy-saving hot stamping is to be enabled. At the same time, it is to be possible to produce a sharp contour of the stamped shape. Safe handling of the stamping die is also to be ensured after use. A quick reaction time in the event of temperature changes of the stamping die would also be advantageous.

The object of the invention is achieved in that the stamping die comprises at least one thermally insulating substrate on which an electrically conductive structure comprising a heating resistor is arranged, and wherein the electrically conductive structure is covered by an electrically insulating film, wherein the surface of the electrically insulating film comprises the profiled stamping surface and the electrically insulating film covers at least the heating resistor such that the electrically insulating film with the stamping surface can be electrically heated by the heating resistor, and wherein the thermally insulating substrate is an oxidic ceramic and/or a metal oxide and the thermally insulating substrate has a thermal conductivity less than 5 W/(m K).

A heating resistor in the present case is understood to be a region of the electrically conductive structure at which, when an electric voltage is applied across the electrically conductive structure or the connections thereof, a large part of the electric voltage drops. At the same time, most heat is thus then generated thereby in this region.

Here, the stamping die may be designed as a sandwich structure, wherein the electrically conductive structure is arranged between the thermally insulating substrate and the electrically insulating film.

A sandwich structure has the advantage that the electrically conductive structure is well protected in the middle.

In accordance with the invention, the electrically conductive structure may also comprise two lines, via which the heating resistor is electrically contactable.

Due to the separation between the heating resistor and the feed lines, it is possible to ensure that the heating region is completely covered by the electrically insulating film, whereas the parts of the line can be exposed. In addition, a more cost-effective material can be selected for the lines.

Here, the lines may in turn have a line cross section larger than the heating resistor, particularly preferably a line cross section at least twice as large.

It is thus ensured that the voltage at the heating resistor drops and the feed lines do not heat up or only heat up to a very small extent.

Furthermore, the lines may be covered at least in regions or substantially by the electrically insulating film and/or the lines consist of copper and/or silver.

Apart from the parts for connection of the stamping die, such as connection contact fields or plugs, the lines may be covered by the electrically insulating film. This also protects the lines against harmful mechanical influences and is therefore preferable in accordance with the invention.

In accordance with a development of the invention, the heating resistor is formed in a meandering manner.

Here, when heating the stamping die, a large part of the temperature gradients, in particular at least 70%, preferably at least 90%, may decline in the region of the lines.

With stamping dies according to the invention, the electrically conductive structure may particularly preferably also be a metal structure, in particular a thick metal film, wherein the heating resistor preferably consists of platinum or iridium.

A thick film made of platinum or iridium can become very hot and is nevertheless chemically stable with respect to the oxygen that is contained in many ceramics or other insulators, even at high temperatures.

In accordance with the invention, the electrically conductive structure may also be 5 µm to 50 µm thick, preferably 10 µm to 20 µm thick.

Thicknesses in these ranges can be used effectively for heating resistors.

Stamping dies according to the invention in which the thermally insulating substrate has a thermal conductivity less than 2 W/(m K), particularly preferably a thermal conductivity less than 1 W/(m K), are particularly preferred.

If the thermal conductivity falls below this level, this causes the heat to be available in the front region of the stamping die used for stamping and also prevents the remaining regions of the stamping die from becoming too hot, thus facilitating the assembly and connection and reducing the risk of injury.

In accordance with a further embodiment of the invention, the thermally insulating substrate may be a metal oxide of a trivalent to pentavalent transition metal, particularly preferably a titanate, an yttrium-oxide-stabilised zirconium oxide ceramic (YSZ) or an $MgTiO_3$ ceramic.

These materials are particularly well suited for producing a stamping die according to the invention, since they have high mechanical stability and at the same time low thermal conductivity.

In accordance with a particularly suitable embodiment of the invention, a thin ceramic film may be arranged between the thermally insulating substrate, in particular the YSZ substrate, and the electrically conductive structure and which electrically insulates the electrically conductive structure from the thermally insulating substrate, wherein the thin ceramic film preferably consists of a metal oxide, particularly preferably of an oxidic ceramic or bivalent or trivalent main-group metal, most preferably of aluminium oxide.

From a temperature of approximately 300° C., the YSZ begins to be electrically conductive in such a way that electrical insulation between the electrically conductive structure and the YSZ substrate is expedient. In particular when the substrate develops a higher electrical conductivity at the temperatures that can be reached in the stamping die and/or the stamping die is to be operated at high temperatures, such an electrically insulating thin film is thus particularly advantageous. The intermediate film can also be used alternatively or additionally however for stronger mechanical connection of the electrically conductive structure to the substrate.

In accordance with the invention, with a stamping die with intermediate film, the intermediate film may have an electrical resistivity of at least $10^6$ Ωm, preferably an electrical resistivity of at least $10^8$ Ωm, particularly preferably an electrical resistivity of at least $10^{10}$ Ωm.

In accordance with the invention, the substrate may be coated with an electrically insulating thin ceramic film based on an oxidic ceramic of bivalent or trivalent main-group metals, in particular of MeO, $Me_3O$ or $Me_2O_3$, for example of $Al_2O_3$.

Furthermore, the electrically insulating film may consist of glass or a glass ceramic.

The glass or the glass ceramic can be particularly well structured and is a good electrical insulator. The profiling of the surface with glass or glass ceramic can be implemented particularly well.

Furthermore, the electrically insulating film may be between 1 μm and 500 μm thick, preferably between 10 μm and 100 μm thick, particularly preferably 30 μm thick.

In accordance with a further embodiment of the invention, the heating resistor can be electrically connected to two connection contact fields or two connection plugs, a connection contact field or a connection plug preferably being arranged on each line at the end of the lines opposite the heating resistor.

Furthermore, the heating resistor may make up half to a third of the width of the electrically conductive structure and/or the heating resistor is formed in the manner of a tip.

With these geometries, the heat can be concentrated particularly well onto the stamping structured surface. The region of the connections then remains particularly cool.

In accordance with the invention, the substrate may also have a substrate length from 5 to 50 mm, in particular from 10 to 40 mm, particularly preferably from 20 to 30 mm, a substrate width from 0.5 to 20 mm, in particular from 2 to 10 mm, particularly preferably from 3 to 5 mm, and/or a substrate thickness from 0.1 to 2 mm, in particular from 0.3 to 1 mm, particularly preferably from 0.4 to 0.6 mm.

Here, it should be noted that excessively short and excessively thick substrates do not provide sufficient temperature differences or temperature gradients. The application of the heating resistor to excessively narrow substrates is difficult. Excessively thin substrates are mechanically unstable.

The width of the electrically conductive structure extends along the substrate length without covering the substrate over the entire length.

Stamping dies according to the invention may preferably be at least twice as long as wide (based on the substrate), preferably 3 to 5 times as long as wide. Furthermore, stamping dies according to the invention may preferably be at least 10 times as long as thick, preferably 30 to 50 times as long as thick.

It may be provided that in the connection region, in which the electrically conductive structure is contacted from the outside with wires, the connection of the wires to the electrically conductive structure may also be relieved of strain, preferably relieved of strain by means of a glass bead.

The object of the invention is also achieved by a method for hot stamping a material using such a stamping die, in which the heating resistor is heated to a temperature between 100° C. and 800° C., preferably between 200° C. and 600° C., particularly preferably between 300° C. and 400° C.

At these temperatures, a sufficient hot stamping is provided on many materials, in particular organic materials.

Here, an organic material may be corroded at least in regions at a temperature between 100° C. and 600° C. in the region of the profiled surface of the stamping die, in particular is pyrolysed and/or oxidised.

It may also be provided that as the stamping die is heated, a temperature gradient may also be set, with which more than half the temperature difference between the temperature in the region of the heating resistor and the ambient temperature, preferably the room temperature, declines in the region of the heating resistor, preferably more than 90%, such that the end of the stamping die opposite the heating resistor has a temperature of less than 50° C., preferably a temperature of less than 40° C.

The setting of a temperature gradient in the stamping die is essential so that the stamping die is not hot at all surfaces. Only as a result of this can the operator be reliably protected and easy installation reliably realised.

The object of the invention is lastly also achieved by a method for producing a stamping die, in which A) a thermally insulating substrate is provided, B) an electrically conductive structure comprising a heating resistor is applied to the thermally insulating substrate, in particular using a thick-film method, particularly preferably is printed on, and C) the electrically conductive structure is covered at least in regions by an electrically insulating film using a screen-printing method or thick-film technology.

Here, it may be provided that before step B), an electrically insulating intermediate film is applied to the thermally insulating substrate, such that, in step B), the electrically conductive structure is applied to the insulating intermediate film on the thermally insulating substrate, wherein the intermediate film is applied preferably by means of a thin-film method, particularly preferably by means of PVD.

Furthermore, lines, applied using thick-film technology, may also be connected on the substrate in the middle third of the heating resistor applied using thick-film technology.

To this end, the lines can be applied and burnt in as paste on the two ends of the heating resistor. The ends of the heating resistor are preferably formed as contact fields.

The invention is based on the surprising finding that it is possible, with a filmed design of the stamping die, to selectively deliver the heat required for the hot stamping in the region of the stamping die comprising the profiled surface for stamping the material. The electric power to this end can be consumed precisely in the region of a heating element. The heating element, in particular with use of feed lines, can be arranged in any position of the stamping die. Due to the thermally insulating properties of the substrate, the regions of the stamping die remote from the heating element thus remain cooler, up to a temperature close to the ambient temperature.

The electric power is mostly introduced in order to be received in the material to be stamped. The consumption of electric energy by the stamping die is thus considerably reduced. At the same time, the stamping die according to the invention cools quickly, and therefore it can be replaced again safely after a relatively short time.

An essential aspect of the present invention is that the temperature gradient primarily falls closely at the heating resistor. This is also achieved substantially in that the lines to the heating resistor (in the present case also referred to as feed lines) have a cross section larger than the electric lines of the heating resistor. The electrical resistance of the heating resistor is thus considerably higher than that of the feed lines. A majority of the electric voltage across the heating resistor thus drops, whereby the temperature of the heating resistor is much higher than that of the feed lines. Alternatively or additionally, the length of the electric line of the heating resistor can be selected so as to be large relative to the feed lines by running the heating resistor in meanders. A large part of the electric voltage thus also drops across the heating resistor, with the discussed consequences.

The heating region defined in a precise manner by means of the measures according to the invention enables a transfer of heat with high resolution and with particularly low thermal loss compared to an external heat source. The high hardness of the ceramic substrate and the resistance thereof to oxidation ensures a longer service life compared to metal hot stamping dies. Even complex gravure procedures can thus be saved.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
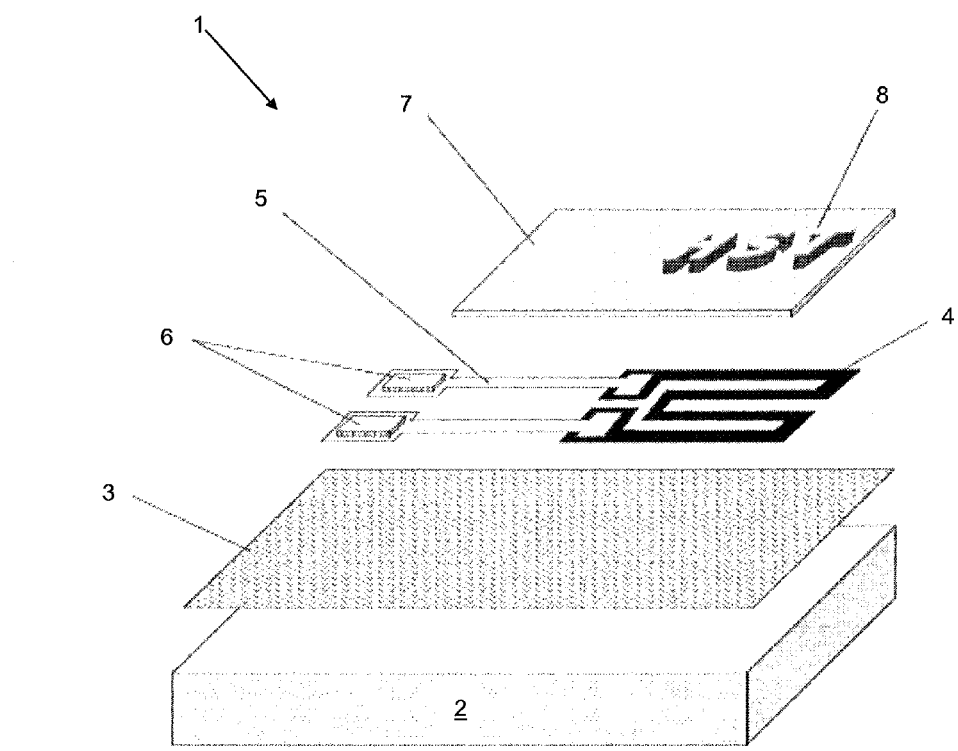
FIG. 1 shows a schematic, perspective, exploded view of a stamping die according to the invention.

FIG. 1 shows a schematic, perspective, exploded view of a stamping die 1 according to the invention. The stamping die 1 comprises a substrate 2 made of yttrium-stabilised zirconium oxide (YSZ). The substrate 2 has dimensions of 25×2×0.4 mm$^3$. The YSZ substrate 2 is coated with a thin film 3 made of $Al_2O_3$. The coating is implemented with the aid of a PVD method (physical vapour deposition). In principle, another thin-film method would also be conceivable in order to produce the thin film 3, such as chemical vapour deposition (CVD), sputtering, or the like.

An Ir paste or a Pt paste is printed onto this ceramic thin film 3 and is burnt to a meandering resistor structure 15 μm thick, which forms the heating resistor 4. The resistor structure 4 ends at each end at a contact field, to which a line 5 burnt from silver paste and 12 mm long is attached in each case. The lines 5 are widened at the substrate end to the connection contact fields 6 in order to electrically connect the stamping die 1 to a printed circuit board made of plastic (not shown) and to mechanically secure the stamping die. The electrical contacting occurs by soldering on, welding on, or connecting to wires (not shown), which are in turn connected by soldering or welding to the printed circuit board and the connection contact fields 6. As mechanical protection and for strain relief, the contactings can be relieved of strain using a glass bead or a synthetic resin bead.

A thick film 7 with a profiling 8 in the form of a relief as a pattern 8 or inscription 8 can be burnt onto the heating resistor 4 and the lines 5 using a glass paste. This glass film 7 protects the heating resistor 4 and the lines 5 thereof, in particular during the hot stamping process.

To melt or corrode organic material, the heating resistor 4 is heated to 300 to 500° C., such that the external temperature of the stamping die 1 in the region of the profiling 8 is above 200° C., in particular 300 to 400° C. In the region of the connection contact fields 6 at the other end of the stamping die 1, the temperature is less than 40° C., such that no specific demands on the plastic of the printed circuit board in terms of the temperature resistance are necessary. A hot stamping die, with use of the chip (stamping die 1) according to the invention does not require an external heat source and can stamp very precise, extremely fine structures.

Figure 2:
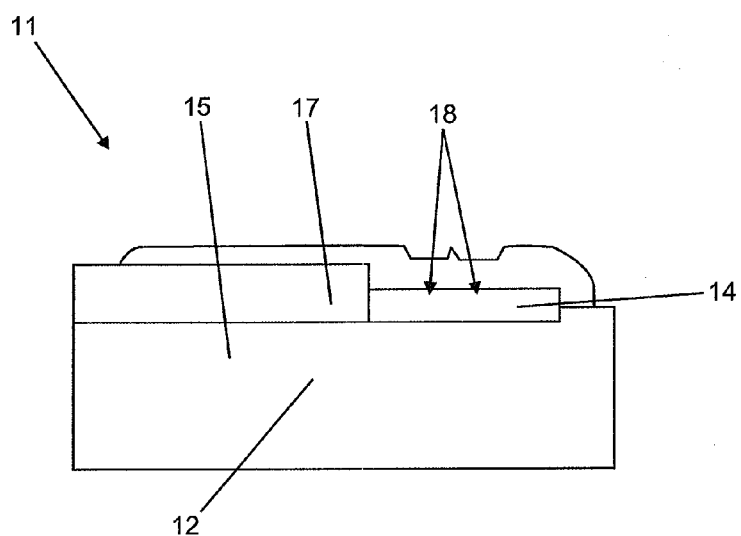
FIG. 2 shows a schematic cross-sectional view of an alternative stamping die according to the invention.

FIG. 2 shows a schematic cross-sectional view of an alternative embodiment of a stamping die 11 according to the invention. An Ir or Pt paste is applied in one half to a thermally insulating 15×4×0.5 mm$^3$ $MgTiO_3$ substrate 12 and is burnt to a meandering heating resistor 14 20 μm thick. A line 15 burnt from silver paste or copper paste is connected onto each of the two electric ends of the heating resistor 14. On the other half of the substrate 12, the lines 15 at the substrate end are widened to contact fields in order to arrange there an electric connection for the stamping die 11, for example in the form of connection wires (not shown).

The lines 15, as shown in FIG. 2, can be thicker than the heating resistor 14 in order to increase the electric resistance of the heating resistor 14 relative to that of the lines 15. This is not necessarily the case however. The same effect is also produced if the heating resistor 14, due to a sufficient number of meanders, has a much longer power line than the feed lines.

The region of connection of the connection wires to the contact fields is relieved of strain by burning in glass paste. Different glass pastes in the form of a pattern 17 or an inscription 17 are burnt one above the other as thick films onto the heating resistor 14 and the lines 15. The patterns 17 have a profiling 18 of the surface in the region of the heating element 14. The glass films protect the heating resistor 14 and the feed lines 15 thereof, in particular during the hot stamping process. Component parts wired in this way are also referred to as film resistors.

The stamping dies (1, 11) according to the invention are thus produced by film resistors. One of the particular aspects of the invention is to be considered precisely herein, that is to say the fact that film resistors are used to form stamping dies 1, 11.

The features of the invention disclosed in the above description, and in the claims, figures and exemplary embodiments may be essential individually and in any arbitrary combination for the implementation of the invention in its various embodiments.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

We claim:

1. A stamping die for hot stamping a material, comprising a profiled stamping surface (8, 18), wherein the stamping die (1, 11) comprises at least one thermally insulating substrate (2, 12), on which an electrically conductive structure (4, 5, 6, 14, 15) comprising a heating resistor (4, 14) is arranged, and in that the electrically conductive structure (4, 5, 6, 14, 15) is covered by an electrically insulating film (7, 17), wherein the surface of the electrically insulating film (7, 17) comprises the profiled stamping surface (8, 18) and the electrically insulating film (7, 17) covers at least the heating resistor (4, 14) such that the electrically insulating film (7, 17) with the stamping surface (8, 18) is electrically heated by the heating resistor (4, 14), and wherein the thermally insulating substrate (2, 12) is an oxidic ceramic and/or a metal oxide and the thermally insulating substrate (2, 12) has a thermal conductivity less than 5 W/(m K).

2. The stamping die according to claim 1, wherein the electrically conductive structure (4, 5, 6, 14, 15) comprises two lines (5, 15), via which the heating resistor (4, 14) is electrically contactable, wherein the lines (5, 15) have a line cross section larger than the heating resistor (4, 14).

3. The stamping die according to claim 2, wherein the lines (5, 15) are covered at least in regions or substantially by the electrically insulating film (7, 17) and/or the lines (5, 15) consist of copper and/or silver.

4. The stamping die according to claim 1, wherein the electrically conductive structure (4, 5, 6, 14, 15) is a metal structure (4, 5, 6, 14, 15), wherein the heating resistor (4, 14) consists of platinum or iridium.

5. The stamping die according to claim 1, wherein the thermally insulating substrate (2, 12) has a thermal conductivity less than 2 W/(m K).

6. The stamping die according to claim 1, wherein the thermally insulating substrate (2, 12) is a metal oxide of a trivalent to pentavalent transition metal.

7. The stamping die according to claim 1, wherein a thin ceramic film (3) is arranged between the thermally insulating substrate (2, 12) and the electrically conductive structure (4, 5, 6, 14, 15) and which electrically insulates the electrically conductive structure (4, 5, 6, 14, 15) from the thermally insulating substrate (2, 12), wherein the thin ceramic film (3) consists of a metal oxide.

8. The stamping die according to claim 1, wherein the electrically insulating film (7, 17) consists of glass or a glass ceramic, which is between 1 μm and 500 μm thick.

9. The stamping die according to claim 2, wherein the heating resistor (4, 14) is electrically connected to two connection contact fields (6) or two connection plugs, a connection contact field (6) or a connection plug preferably being arranged on each line (5, 15) at the end of the lines (5, 15) opposite the heating resistor (4, 14).

10. The stamping die according to claim 1, wherein the heating resistor (4, 14) makes up half to a third of the width of the electrically conductive structure (4, 5, 6, 14, 15) and/or the heating resistor (4, 14) is formed in the manner of a tip.

11. A method for hot stamping a material using a stamping die (1, 11), the stamping die having a profiled stamping surface (8, 18), wherein the stamping die (1, 11) includes at least one thermally insulating substrate (2, 12), on which an electrically conductive structure (4, 5, 6, 14, 15) comprising a heating resistor (4, 14) is arranged, the electrically conductive structure (4, 5, 6, 14, 15) being covered by an electrically insulating film (7, 17), wherein the surface of the electrically insulating film (7, 17) comprises the profiled stamping surface (8, 18) and the electrically insulating film (7, 17) covers at least the heating resistor (4, 14) such that the electrically insulating film (7, 17) with the stamping surface (8, 18) is electrically heated by the heating resistor (4, 14), and wherein the thermally insulating substrate (2, 12) is an oxidic ceramic and/or a metal oxide and the thermally insulating substrate (2, 12) has a thermal conductivity less than 5 W/(m K), the method comprising:
heating the heating resistor (4, 14) to a temperature between 100° C. and 800° C.

12. The method according to claim 11, wherein an organic material is corroded at least in regions at a temperature between 100° C. and 600° C. in the region of the profiled surface (8, 18) of the stamping die (1, 11).

13. The method according to claim 11, wherein as the stamping die (1, 11) is heated, a temperature gradient is set, with which more than half the temperature difference between the temperature in the region of the heating resistor (4, 14) and the ambient temperature declines in the region of the heating resistor (4, 14) such that the end of the stamping die (1, 11) opposite the heating resistor (4, 14) has a temperature of less than 50° C.

14. A method for producing a stamping die having a profiled stamping surface (8, 18), wherein the stamping die (1, 11) includes at least one thermally insulating substrate (2, 12), on which an electrically conductive structure (4, 5, 6, 14, 15) comprising a heating resistor (4, 14) is arranged, and in that the electrically conductive structure (4, 5, 6, 14, 15) is covered by an electrically insulating film (7, 17), wherein the surface of the electrically insulating film (7, 17) comprises the profiled stamping surface (8, 18) and the electrically insulating film (7, 17) covers at least the heating resistor (4, 14) such that the electrically insulating film (7, 17) with the stamping surface (8, 18) is electrically heated by the heating resistor (4, 14), and wherein the thermally insulating substrate (2, 12) is an oxidic ceramic and/or a metal oxide and the thermally insulating substrate (2, 12) has a thermal conductivity less than 5 W/(m K). the method comprising
A) providing the thermally insulating substrate (2, 12),
B) applying the electrically conductive structure (4, 5, 6, 14, 15) comprising a heating resistor (4, 14) to the thermally insulating substrate (2, 12), and
C) covering the electrically conductive structure (4, 5, 6, 14, 15) at least in regions by the electrically insulating film (7, 17) using a screen-printing method or thick-film technology.

15. The method according to claim 14, wherein before step B), an electrically insulating intermediate film (3) is applied to the thermally insulating substrate (2, 12), such that, in step B), the electrically conductive structure (4, 5, 6, 14, 15) is applied to the insulating intermediate film (3) on the thermally insulating substrate (2, 12), wherein the intermediate film (3) is applied by a thin-film method.

\* \* \* \* \*